US010625376B2

(12) United States Patent
Washizuka

(10) Patent No.: US 10,625,376 B2
(45) Date of Patent: Apr. 21, 2020

(54) BONDING MEMBER, METHOD FOR MANUFACTURING BONDING MEMBER, AND BONDING METHOD

(71) Applicant: Murata Manufacturing Co., Ltd., Nagaokakyo-shi, Kyoto-fu (JP)

(72) Inventor: Seitaro Washizuka, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 229 days.

(21) Appl. No.: 15/864,462

(22) Filed: Jan. 8, 2018

(65) Prior Publication Data
US 2018/0126495 A1 May 10, 2018

Related U.S. Application Data

(63) Continuation of application No. PCT/JP2016/073532, filed on Aug. 10, 2016.

(30) Foreign Application Priority Data

Sep. 15, 2015 (JP) .................................. 2015-181369

(51) Int. Cl.
*B23K 35/00* (2006.01)
*B23K 35/02* (2006.01)
(Continued)

(52) U.S. Cl.
CPC ............ *B23K 35/0227* (2013.01); *B23K 1/00* (2013.01); *B23K 35/26* (2013.01); *B23K 35/262* (2013.01);
(Continued)

(58) Field of Classification Search
CPC .... B23K 35/0227; B23K 35/40; B23K 35/26; B23K 35/406; B23K 35/302;
(Continued)

(56) References Cited

U.S. PATENT DOCUMENTS 3,426,420 A * 2/1969 Grant ................... B23K 35/007
228/130
3,479,731 A * 11/1969 Mantel ................. B23K 1/0008
228/182
(Continued)

FOREIGN PATENT DOCUMENTS

JP         S52-29656 U    3/1977
JP         S58-100992 A   6/1983
(Continued)

OTHER PUBLICATIONS

Written Opinion of the International Searching Authority issued in International Application No. PCT/JP2016/080159, dated Dec. 6, 2016.
(Continued)

*Primary Examiner* — Kiley S Stoner
(74) *Attorney, Agent, or Firm* — Arent Fox LLP

(57) ABSTRACT

A bonding member that includes a base material that has a spiral shape when viewing a cross section thereof orthogonal to a longitudinal direction thereof, and contains a low melting point metal; and a coating film in a gap between opposed surfaces of the base material when the base material is in the spiral shape. The coating film contains metal particles of a high melting point metal that forms an intermetallic compound having a melting point higher than that of the low melting point metal by reaction of the high melting point metal with a melt of the low melting point metal. The low melting point metal is, for example, Sn or a Sn alloy. The high melting point metal is, for example, a Cu—Ni alloy, a Cu—Mn alloy, a Cu—Cr alloy, or a Cu—Al alloy.

16 Claims, 12 Drawing Sheets

(51) Int. Cl.

| | | |
|---|---|---|
| *C22C 9/00* | (2006.01) | |
| *B23K 35/26* | (2006.01) | |
| *B23K 35/40* | (2006.01) | |
| *C22C 13/00* | (2006.01) | |
| *C22C 13/02* | (2006.01) | |
| *C22C 9/06* | (2006.01) | |
| *B23K 1/00* | (2006.01) | |
| *B23K 35/30* | (2006.01) | |
| *H05K 3/34* | (2006.01) | |

(52) U.S. Cl.
CPC ............ *B23K 35/302* (2013.01); *B23K 35/40* (2013.01); *B23K 35/406* (2013.01); *C22C 9/00* (2013.01); *C22C 9/06* (2013.01); *C22C 13/00* (2013.01); *C22C 13/02* (2013.01); *H05K 3/3457* (2013.01); *H05K 3/3489* (2013.01); *H05K 2203/0405* (2013.01); *H05K 2203/049* (2013.01); *H05K 2203/0415* (2013.01)

(58) Field of Classification Search
CPC  B23K 35/262; B23K 35/025; B23K 35/0233; B23K 35/0222–025; B23K 1/00–206; C22C 9/06; C22C 13/02; C22C 13/00; C22C 9/00; H05K 3/3489; H05K 3/3457; H05K 2203/049; H05K 2203/0415; H05K 2203/0405
USPC ................ 228/179.1–180.22, 245–262, 56.3
See application file for complete search history.

(56) References Cited

U.S. PATENT DOCUMENTS

| | | | |
|---|---|---|---|
| 4,398,975 A | 8/1983 | Ohsawa et al. | |
| 5,597,656 A * | 1/1997 | Carey, II | B32B 15/01 |
| | | | 428/646 |
| 5,965,197 A * | 10/1999 | Jin | B23K 35/0244 |
| | | | 427/180 |
| 6,186,390 B1 * | 2/2001 | Tadauchi | B23K 35/0227 |
| | | | 228/56.3 |
| 6,738,257 B1 | 5/2004 | Lai | |
| 7,516,548 B2 * | 4/2009 | Twigg | B23K 20/023 |
| | | | 228/165 |
| 8,152,953 B2 | 4/2012 | Yoshimura et al. | |
| 8,563,872 B2 | 10/2013 | Hirai et al. | |
| 9,105,987 B2 | 8/2015 | Nakano et al. | |
| 2003/0196732 A1 * | 10/2003 | Carey | B32B 15/01 |
| | | | 148/537 |
| 2004/0134966 A1 * | 7/2004 | Chang | B21B 3/00 |
| | | | 228/56.3 |
| 2004/0211291 A1 * | 10/2004 | Ono | B22F 9/06 |
| | | | 75/331 |
| 2005/0022975 A1 | 2/2005 | Rosenfeld et al. | |
| 2005/0022984 A1 | 2/2005 | Rosenfeld et al. | |
| 2005/0098609 A1 | 5/2005 | Greenhut et al. | |
| 2006/0061974 A1 * | 3/2006 | Soga | B23K 3/063 |
| | | | 361/743 |
| 2006/0180296 A1 | 8/2006 | Liu | |
| 2007/0240854 A1 | 10/2007 | Liu et al. | |
| 2007/0277961 A1 | 12/2007 | Yu et al. | |
| 2008/0012131 A1 | 1/2008 | Tanaka | |
| 2008/0213614 A1 * | 9/2008 | Wieres | B01J 35/04 |
| | | | 428/593 |
| 2010/0197534 A1 | 8/2010 | Yuasa | |
| 2011/0068149 A1 | 3/2011 | Hirano et al. | |
| 2012/0156512 A1 * | 6/2012 | Nakano | B23K 1/00 |
| | | | 428/457 |
| 2013/0233618 A1 | 9/2013 | Nakano et al. | |
| 2013/0270001 A1 | 10/2013 | Nakano et al. | |
| 2013/0299236 A1 | 11/2013 | Nakano et al. | |
| 2014/0174605 A1 | 6/2014 | Nakagawa et al. | |
| 2014/0174706 A1 * | 6/2014 | Yamada | B23K 35/0233 |
| | | | 165/185 |
| 2014/0178703 A1 | 6/2014 | Nakano et al. | |
| 2014/0193650 A1 | 7/2014 | Nakano et al. | |
| 2014/0345939 A1 * | 11/2014 | Nakano | C22C 9/04 |
| | | | 174/94 R |
| 2014/0356055 A1 * | 12/2014 | Nakano | C22C 9/00 |
| | | | 403/271 |
| 2014/0363221 A1 * | 12/2014 | Nakano | B23K 1/00 |
| | | | 403/272 |
| 2015/0034701 A1 * | 2/2015 | Takaoka | H01G 4/2325 |
| | | | 228/101 |
| 2015/0072165 A1 * | 3/2015 | Sunaga | B23K 1/20 |
| | | | 428/610 |
| 2015/0204617 A1 | 7/2015 | Thanhlong et al. | |
| 2016/0031027 A1 * | 2/2016 | Chu | B23K 1/0014 |
| | | | 228/245 |
| 2016/0240505 A1 | 8/2016 | Tatsumi et al. | |
| 2016/0288245 A1 | 10/2016 | Ishino et al. | |
| 2016/0297029 A1 * | 10/2016 | Ishino | B23K 20/002 |
| 2016/0338201 A1 | 11/2016 | Kiyono et al. | |
| 2017/0252872 A1 * | 9/2017 | Hartmann | B23K 1/0012 |
| 2018/0092258 A1 | 3/2018 | Beers et al. | |

FOREIGN PATENT DOCUMENTS

| | | |
|---|---|---|
| JP | S63-183772 A | 7/1988 |
| JP | H03-110392 A | 5/1991 |
| JP | H06-47579 A | 2/1994 |
| JP | H07-299591 A | 11/1995 |
| JP | H09-119789 A | 5/1997 |
| JP | 2001-205476 A | 7/2001 |
| JP | 2002-301588 A | 10/2002 |
| JP | 2004-174522 A | 6/2004 |
| JP | 2005-52856 A | 3/2005 |
| JP | 3110111 U | 6/2005 |
| JP | 2009-106993 A | 5/2009 |
| JP | 5018978 B1 | 9/2012 |
| JP | 2013/212524 A | 10/2013 |
| JP | 2014-180690 A | 9/2014 |
| JP | 2015-42421 A | 3/2015 |
| JP | 5685656 B1 | 3/2015 |
| JP | 2015-93295 A | 5/2015 |
| JP | 2015/135211 A | 7/2015 |
| JP | 2015-147989 A | 8/2015 |
| JP | 2015-166101 A | 9/2015 |
| WO | WO 98/33621 A1 | 8/1998 |
| WO | WO 2012/066795 A1 | 5/2012 |
| WO | WO 2013/038816 A1 | 3/2013 |
| WO | WO 2013/038817 A1 | 3/2013 |
| WO | WO 2015/105089 A1 | 7/2015 |
| WO | WO-2015105088 A1 * | 7/2015 |

OTHER PUBLICATIONS

International Search Report issued in International Application No. PCT/JP2016/073532, dated Nov. 8, 2016.

International Search Report issued in International Application No. PCT/JP2016/075615, dated Nov. 8, 2016.

International Search Report issued in International Application No. PCT/JP2016/080159, dated Dec. 6, 2016.

Written Opinion of the International Searching Authority issued in International Application No. PCT/JP2016/073532, dated Nov. 8, 2016.

Written Opinion of the International Searching Authority issued in International Application No. PCT/JP2016/075615, dated Nov. 15, 2016.

* cited by examiner

BONDING MEMBER, METHOD FOR MANUFACTURING BONDING MEMBER, AND BONDING METHOD

CROSS REFERENCE TO RELATED APPLICATIONS

The present application is a continuation of International application No. PCT/JP2016/073532, filed Aug. 10, 2016, which claims priority to Japanese Patent Application No. 2015-181369, filed Sep. 15, 2015, the entire contents of each of which are incorporated herein by reference.

FIELD OF THE INVENTION

The present invention relates to a bonding member used for, for example, bonding an electronic component to a substrate, a method for manufacturing a bonding member, and a bonding method using a bonding member.

BACKGROUND OF THE INVENTION

In the prior art, as a bonding member used for, for example, mounting an electronic component to a substrate, there has been developed a paste-like bonding member including low melting point metal particles formed of Sn or the like and high melting point metal particles formed of Cu alloy or the like (see, for example, Patent Document 1). In the bonding member, when a low melting point metal is melted, a melt of the low melting point metal reacts with the high melting point metal to form an intermetallic compound of the low melting point metal and the high melting point metal. This intermetallic compound has a melting point higher than that of the low melting point metal, so that in a joint portion formed by melting and hardening the bonding member, a temperature condition at which the joint portion is remelted is higher than the melting point of the low melting point metal.

Patent Document 1: WO 2013/038816

SUMMARY OF THE INVENTION

Since the above-described bonding member is in the form of a paste, a large amount of a nonmetallic component such as a resin or a solvent is added together with the particles of the low melting point metal or the high melting point metal. Accordingly, when the bonding member is melted, the nonmetallic component volatilizes, and voids due to a volatile gas easily occur at the joint portion formed by hardening the melted bonding member.

Thus, the applicant has been developing a wire-shaped bonding member which contains only a small amount of nonmetallic component as a bonding member containing a low melting point metal and a high melting point metal. However, there are the following problems to process the low melting point metal and the high melting point metal into a wire shape.

In order to manufacture a bonding member in which high melting point metal particles are dispersed in a low melting point metal wire, when the low melting point metal is melted and kneaded with the high melting point metal particles during the manufacturing process, the bonding member itself contains an intermetallic compound, so that the temperature condition during melting of the bonding member becomes higher than the melting point of the low melting point metal.

When a wire is processed by pressure bonding of the low melting point metal particles and the high melting point metal particles, it is difficult to make the binding force between the particles sufficient, so that only a fragile wire can be obtained. Consequently, simple winding of the wire causes exfoliation of the particles and breakage of the wire.

Thus, an object of the present invention is to provide a low brittle (non-brittle) wire-shaped bonding member in which the temperature condition during remelting after bonding is higher than the temperature condition during bonding, a method for manufacturing the bonding member, and a bonding method using the bonding member.

A bonding member according to an aspect of the present invention has a wire shape and includes a base material that has a spiral shape when viewing a cross section thereof orthogonal to a longitudinal direction thereof, and contains a low melting point metal; and a film provided in a gap between opposed surfaces of the base material when wound into the spiral shape and when viewing the cross section of the base material. The film contains a high melting point metal that forms an intermetallic compound having a melting point higher than a melting point of the low melting point metal by reaction of the high melting point metal with a melt of the low melting point metal. For example, the low melting point metal may be Sn or a Sn alloy, and the high melting point metal may be a Cu—Ni alloy, a Cu—Ni—Co alloy, a Cu—Ni—Fe alloy, a Cu—Mn alloy, a Cu—Cr Alloy, or a Cu—Al alloy.

In such a bonding member, when the low melting point metal is melted, the high melting point metal reacts with the melt of the low melting point metal to form an intermetallic compound. When this melt is hardened, it is possible to provide a joint portion in which a temperature condition for remelting is higher than the melting point of the low melting point metal. This bonding member can be formed into a wire shape by disposing a film on a surface of a flat film-shaped base material and winding the film and the base material. Thus, since the bonding member can be manufactured without heating to melt the low melting point metal, the temperature condition during bonding can be reduced (the temperature condition can be set near the melting point of the low melting point metal). In addition, since this bonding member can be formed without pressure bonding of metal particles, brittleness can be made low (the bonding member can be rendered non-brittle).

It is preferable that the film contains metal particles of the high melting point metal and flux. With this configuration, since a surface oxide film of metal can be removed by the flux during melting of the bonding member, a good joint portion formed by efficiently reacting the high melting point metal with the low melting point metal can be obtained.

A weight ratio of the metal particles to the flux is preferably in a range of 75:25 to 99.5:0.5. When the weight ratio of the metal particles is not less than 75%, it becomes easy to obtain the amount of the high melting point metal necessary for converting substantially the entire bonding member into an intermetallic compound. When the weight ratio of the metal particles is not more than 99.5%, the metal particles can be easily disposed as a film with appropriate viscosity on the base material.

It is preferable that the metal particles have an average particle size (D50) of not less than 0.1 μm and not more than 30 When the particle size is not less than 0.1 μm, it is possible to prevent a particle surface area per unit weight of the metal particles from becoming extremely large and to suppress inhibition of formation reaction of the intermetallic compound due to the surface oxide film. When the particle size is not more than 30 μm, the center portion of each of the metal particles can also be utilized for the formation reaction of the intermetallic compound.

The film may have a spiral shape in a cross section of the base material. This configuration can be formed by forming the film on substantially the entire main surface of the base material and winding the film together with the base material. Accordingly, the film is easily formed. In addition, the film may be dispersedly arranged at a plurality of positions in the cross section of the base material. With this configuration, it is possible to increase an area of a region where both surfaces of the base material are in contact with each other and bonded in the bonding member, and it is possible to make it difficult for defects such as peeling to occur in the bonding member.

The above-described bonding member may further include a core material that is provided at a center portion in the cross section of the base material and that contains a low melting point metal. With this configuration, it is possible to increase the workability and the shape reproducibility (shape accuracy) when the base material is formed into a wire shape by winding the base material during manufacturing.

The above-described bonding member may have a flat shape. With this configuration, as a bonding method using the bonding member, it is possible to use not only a bonding method using a soldering iron or the like but also a bonding method using thermocompression bonding or the like. Specifically, when a wire-shaped bonding member is sliced into a pieces and the resulting piece is arranged on a substrate and thus to be melted and solidified, the bonding member has a flat shape, so that the bonding member can be stably disposed on the substrate.

Further, a bonding method according to the present invention includes a step of disposing the above-described flat bonding member between a first bonding target and a second bonding target and heating the flat bonding member, the first bonding target and the second bonding target while applying pressure between the first bonding target and the second bonding target. With this bonding method, the bonding member can be bonded between the first bonding target and the second bonding target by using thermocompression bonding without using a soldering iron or the like.

A method for manufacturing a bonding member according to the present invention includes the steps of providing, on a flat film-shaped base material containing a low melting point metal, a film containing a high melting point metal that forms an intermetallic compound having a melting point higher than a melting point of the low melting point metal by reaction of the high melting point metal with a melt of the low melting point metal; and winding the base material provided with the film into a spiral shape. With this manufacturing method, the above-described bonding member can be easily manufactured.

According to the present invention, in a wire-shaped bonding member, the temperature condition during remelting after bonding can be made higher than the temperature condition during bonding, and the brittleness can be made low (the bonding member can be rendered non-brittle).

DETAILED DESCRIPTION OF PREFERRED EMBODIMENTS OF THE INVENTION

Hereinafter, bonding members according to embodiments of the present invention, a method of manufacturing these bonding members, and a bonding method using the bonding members will be described. Each of the following embodiments is a merely example, and main configurations to be explained in the embodiments can be optionally recombined between the embodiments.

Figure 1:
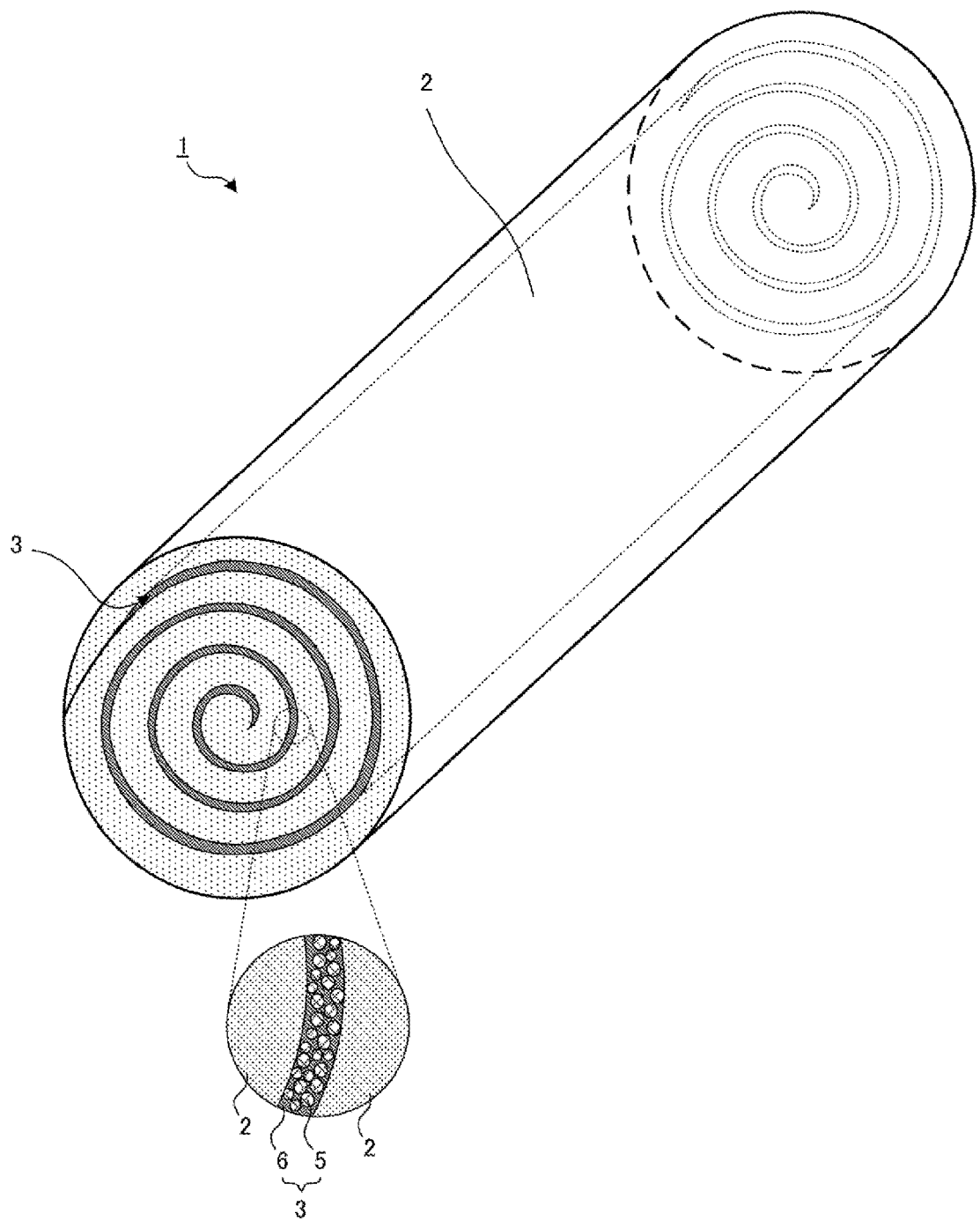
FIG. 1 is a schematic view showing a portion of a bonding member according to a first embodiment of the present invention.

FIG. 1 is a perspective view schematically showing a portion of a bonding member 1 according to a first embodiment of the present invention.

The entire bonding member 1 has a wire shape longer than the portion shown in the figure and has flexibility. The bonding member 1 is configured to include a base material 2 and a coating film 3. The base material 2 and the coating film 3 each have a spiral shape when viewing a cross section orthogonal to the longitudinal direction of the bonding member 1 and each extend in the axial direction (longitudinal direction) of the bonding member 1 while having substantially the same cross-sectional shape. That is, a bonding interface of the base material 2 and the coating film 3 extends spirally inside the cross section of the bonding member 1. The coating film 3 is provided on one main surface of the base material 2 and wound together with the base material 2 so as to be located inside the base material 2. Thus, the coating film 3 is provided in a gap portion where both surfaces of the base material 2 face each other inside the bonding member 1 when viewing the cross section orthogonal to the longitudinal direction of the bonding member.

The main material of the base material 2 is a low melting point metal such as Sn or a Sn alloy (such as Sn—Ag—Cu, Sn—Ag, Sn—Cu, Sn—Bi, Sn—Sb, Sn—Au, Sn—Pb, or Sn—Zn). The surface of the base material 2 is covered with an oxide film of the low melting point metal.

The coating film 3 includes metal particles 5 and a coating material 6. The metal particles 5 are dispersedly arranged inside the coating material 6. The material of the metal particle 5 is a high melting point metal that reacts with the low melting point metal of the base material 2 to form an intermetallic compound and that has a melting point higher than that of the above-described low melting point metal. The surface of the metal particle 5 is covered with an oxide film of the high melting point metal. More specifically, the high melting point metal is a Cu-10 Ni alloy, a Cu—Ni alloy having a proportion of Ni of 5 to 20% by weight, a Cu—Ni—Co alloy having a proportion of Co of 1 to 10% by weight and a proportion of total amount of Ni and Co of 5 to 20%, a Cu—Ni—Fe alloy having a proportion of Fe of 1 to 10% by weight and a proportion of total amount of Ni and Fe of 5 to 20% by weight, a Cu—Mn alloy having a proportion of Mn of 5 to 20% by weight, a Cu—Cr alloy or a Cu—Al alloy. The high melting point metal reacts with a melt of the above-described low melting point metal to form an intermetallic compound and has a melting point higher than that of the above-described low melting point metal. In addition, the intermetallic compound formed by reacting the high melting point metal with the above-described low melting point metal also has a melting point higher than that of the above-described low melting point metal.

The coating material 6 preferably has viscosity and fluidity at least when the coating film 3 is provided on the surface of the base material 2. The coating material 6 herein adopts a material which is in a solid state at normal temperature and softens at a temperature lower than the melting point of the base material 2 (low melting point metal). The metal particles 5 are kneaded in the coating material 6 in a state where the coating material 6 is softened by heating to a temperature lower than the melting point of the base material 2 (low melting point metal), and the coating material 6 is provided on the surface of the base material 2 by coating or the like. For this reason, the bonding member 1 has a configuration in which the whole is constituted of a solid structure at normal temperature and the strength is high. As the coating material 6, a material having viscosity and fluidity at normal temperature may be adopted. In addition, the coating material 6 in the state of powders having no viscosity or fluidity may be sprinkled with the metal particles 5 on the surface of the base material 2 having a flat film shape during manufacturing, and these powders are wound together with the base material 2 to be subjected to wire drawing, and thus to pressure bond the powders to each other, so that the bonding member 1 may be formed.

Although any material may be used as long as it exhibits the above-described properties as a specific material of the coating material 6, the coating material 6 preferably contains a rosin-based flux. When the coating material 6 contains a rosin-based flux, a surface oxide film of the high melting point metal or the low melting point metal is removed, and the high melting point metal and the low melting point metal can be efficiently reacted with each other during soldering using the bonding member 1. As the rosin-based flux, it is possible to adopt appropriate rosin materials such as natural rosin, rosin derivatives such as hydrogenated rosin, dispro-portionated rosin, polymerized rosin, unsaturated dibasic acid modified rosin, and acrylic acid modified rosin, and a mixture thereof.

Further, the coating material 6 may contain an activator for accelerating the reaction of the flux. As the activator, it is possible to adopt appropriate activator materials such as monocarboxylic acids (e.g., formic acid, acetic acid, lauric acid, palmitic acid, stearic acid, benzoic acid, etc.), dicarboxylic acids (e.g., oxalic acid, malonic acid, succinic acid, glutaric acid, adipic acid, suberic acid, azelaic acid, sebacic acid, phthalic acid, etc.), bromoalcohols (e.g., 1-bromo-2-butanol, etc.), hydrohalogenic acid salts of organic amines, bromoalkanes, bromoalkenes, benzyl bromides, polyamines, and a chlorine-based activator. The coating material 6 may, if necessary, contain an organic additive such as resin, thixo agent, thermosetting resin, antioxidant, flame retardant, dispersant, leveling agent, defoaming agent, delustering agent, or plasticizer.

The weight ratio of the metal particles 5 to the coating material 6 (flux) is preferably in the range of metal particles 5:coating material 6=75:25 to 99.5:0.5. If the amount of the metal particles 5 to be contained is too much larger than the above amount, sufficient viscosity cannot be obtained when the coating film 3 is provided on the base material 2, so that the metal particles 5 may fall off from the coating film 3. On the other hand, if the amount of the metal particles 5 to be contained is too small, the low melting point metal cannot be sufficiently reacted, and a large amount of unreacted low melting point metal remains in an intermetallic compound, so that it may become difficult to satisfy the specifications as the bonding member 1 (such as remelting temperature conditions and strength after bonding). Accordingly, when the weight ratio of the metal particles 5 to the coating material 6 is set within the above range, the low melting point metal and the high melting point metal are reacted with an appropriate amount to form an intermetallic compound, and it becomes easy to realize desired specifications.

Figure 2:
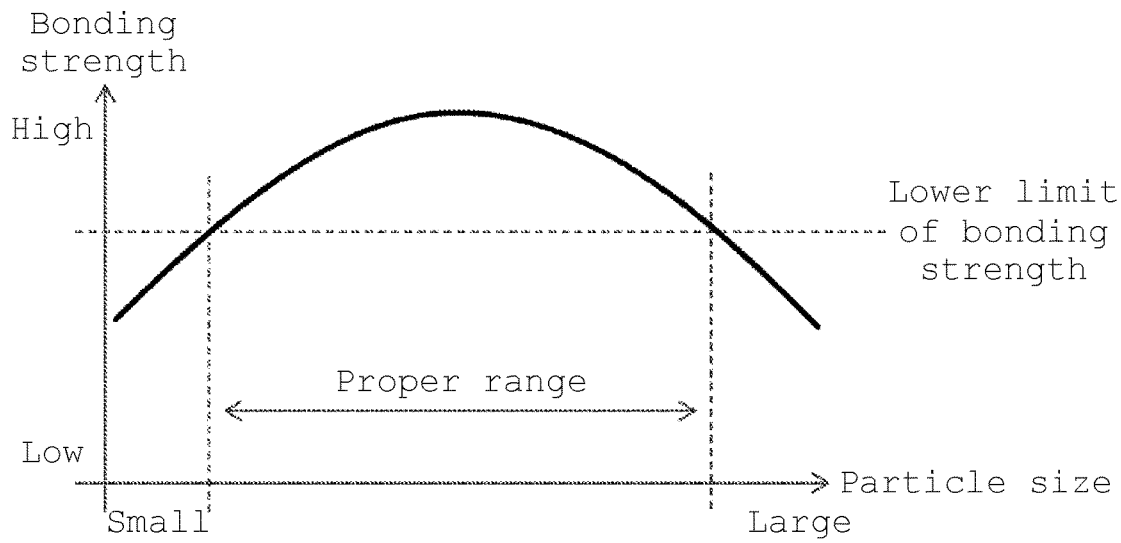
FIG. 2 is a graph showing a relationship between a particle size of metal particle and bonding strength in the bonding member according to the first embodiment of the present invention.

It is preferable that the metal particles 5 have an average particle size (D50) in the range of 0.1 to 30 The average particle size of the metal particles 5 greatly affects the amount of the intermetallic compound to be formed, and therefore when the average particle size is made appropriate, it is possible to improve the bonding strength by a joint portion realized by bonding using the bonding member 1. The average particle size (D50) means a particle size at an integrated value of 50% in particle size distribution obtained by a laser diffraction/scattering method. For example, FIG. 2 is a graph schematically showing a relationship between the average particle size (D50) of the metal particles 5 and the bonding strength realized by bonding using the bonding member 1. There is an optimum value for maximizing the bonding strength in the average particle size, and the bonding strength decreases as the average particle size departs from the optimum value. When the average particle size largely departs from the optimum value, the bonding strength becomes lower than the lower limit defined by the specifications and the like, so that appropriate bonding cannot be realized in some cases. More specifically, if the average particle size (D50) of the metal particles 5 is less than 0.1 μm, a particle surface area per unit weight of the metal particles 5 becomes remarkably large, and the formation reaction is inhibited by this surface oxide film, so that the amount of the intermetallic compound to be formed is reduced. If the particle size is more than 30 μm, the particle center portion of each of the metal particles 5 cannot be used for the formation reaction of the intermetallic compound, and the high melting point metal used for the formation reaction will be deficient, so that the amount of the intermetallic compound to be formed is reduced. When the amount of the intermetallic compound to be formed is reduced, the bonding strength by the joint portion decreases. Accordingly, when the average particle size (D50) of the metal particles 5 is set within the above range, the low melting point metal and the high melting point metal are reacted with each other at an appropriate amount to form an intermetallic compound, and it becomes easy to realize the desired bonding strength and the remelting temperature conditions.

The base material 2 and the coating film 3 may contain Ag, Au, Al, Bi, C, Co, Cu, Fe, Ga, Ge, In, Mn, Mo, Ni, P, Pb, Pd, Pt, Si, Sb, Zn and the like. They may be added as impurities contained in the base material 2 and the metal particles 5 or may be added as metal powders added to the coating material 6, metal films formed on the surface of the base material 2 or the metal particles 5, or the like. When they are added as metal powders, metal films, or the like, they may be contained in the form of a metal complex or a metal compound.

Figure 3:
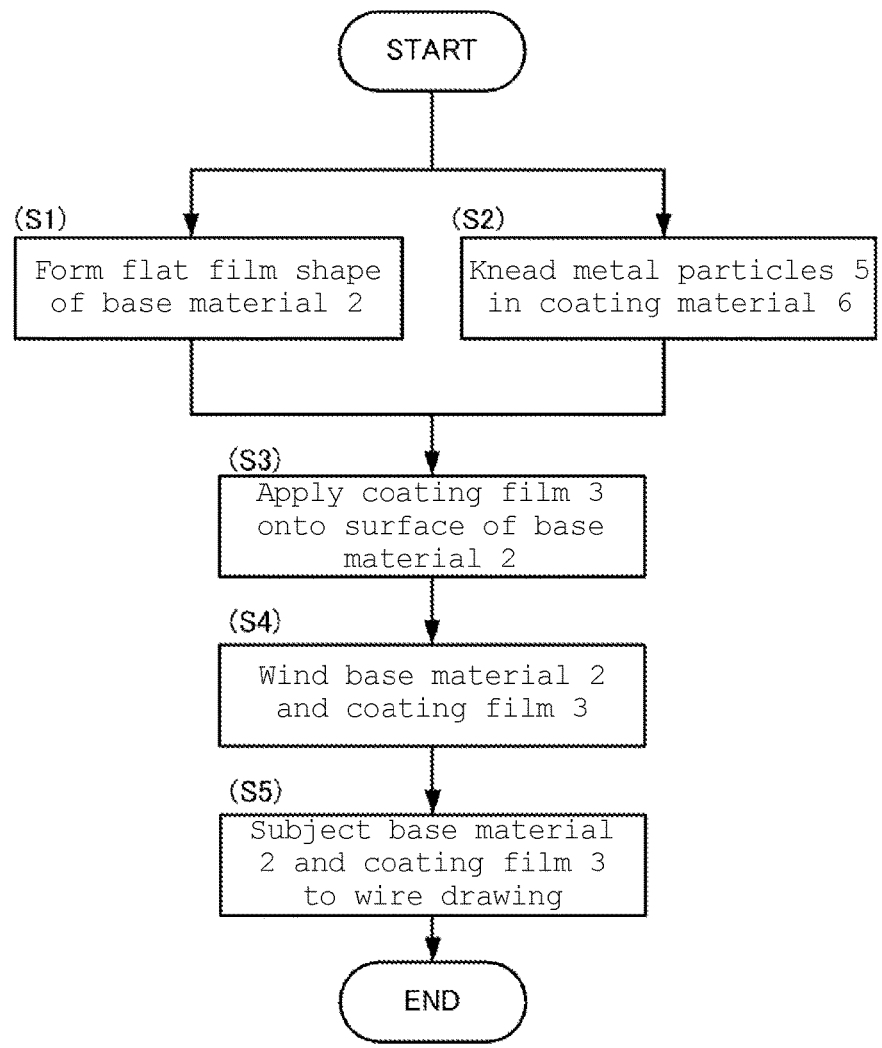
FIG. 3 is a diagram showing an example of a method of manufacturing the bonding member according to the first embodiment of the present invention.

The bonding member 1 having the above configuration can be manufactured by the following manufacturing method. FIG. 3 is a flowchart showing an example of a method for manufacturing the bonding member 1.

In the manufacture of a bonding member 1, first, a base material 2 having a flat film shape and formed of low melting point metal is formed (S1).

Metal particles 5 formed of high melting point metal are kneaded in a coating material 6 in a state of being softened by heating (S2).

Then, the coating material 6 kneaded with the metal particles 5 is provided on one main surface of the base material 2 by means of coating or the like while softened by heating (S3).

Then, the base material 2 and a coating film 3 are wound such that the surface of the base material 2, on which the coating film 3 is provided, is positioned inside (S4). Thereafter, if necessary, the base material 2 and the coating film 3 are extended by wire drawing so that the final wire diameter and the like have the desired dimensions, and then stretched such that the wire size becomes small and the axial length becomes long (S5). At this time, the wire drawing may be carried out in a state where the coating material 6 is softened by heating.

The bonding member 1 having a wire shape and containing the high melting point metal and the low melting point metal can be easily manufactured by such a manufacturing method. With such a manufacturing method, the base material 2 can be produced without heating to such an extent that the low melting point metal melts, and the bonding member 1 itself does not contain an intermetallic compound. Accordingly, the temperature condition during bonding of the bonding member 1 can be made in the vicinity of the melting point of the low melting point metal which is lower than the melting point of the intermetallic compound. In addition, the base material 2 can be formed without pressure bonding of metal particles, and brittleness can be made low (the bonding member can be rendered non-brittle). A specific method for manufacturing the bonding member 1 may be realized by the other processes described above. For example, the bonding member 1 having the above-described configuration can be manufactured by wire drawing in which a spiral groove or hole is formed in a columnar member formed of a low melting point metal, the coating material 6 including the metal particles 5 is injected in the groove or hole, and a wire is extended and drawn out from the columnar member. The wire drawing described above is not necessarily performed.

The strength of the bonding member 1 as a wire can be made relatively high by spiral formation of the coating film 3 and the base material 2. Here, the strength of the bonding member 1 according to the present embodiment as a wire and the strength of a bonding member 1A according to a comparative example as a wire will be described.

Figure 4A:
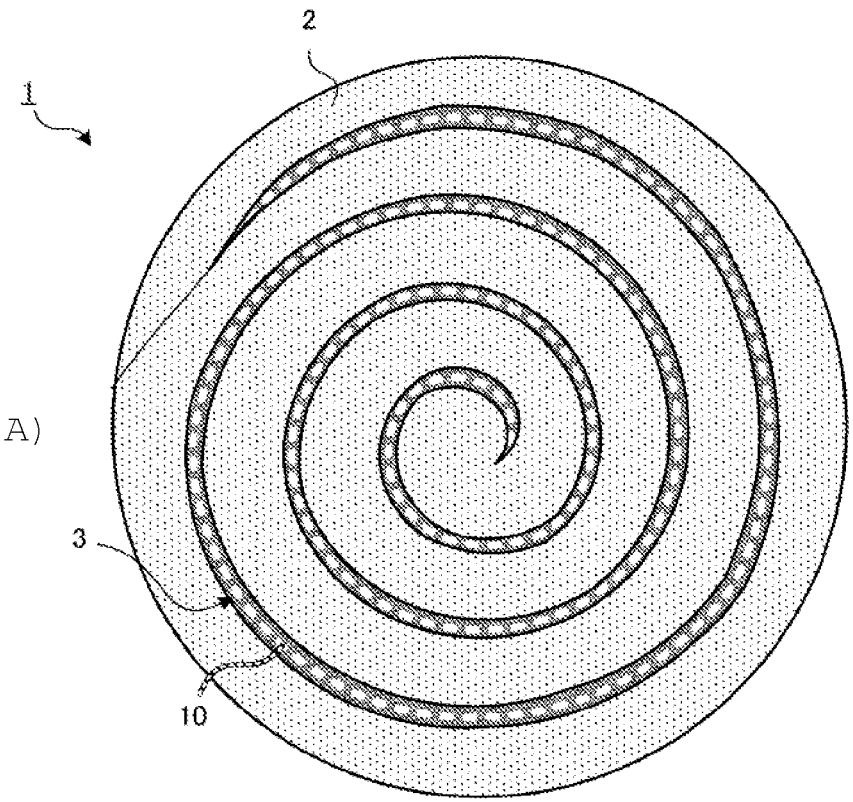
FIGS. 4(A) and 4(B) are views each schematically showing a bonding method using the bonding member according to the first embodiment of the present invention.
Figure 4B:
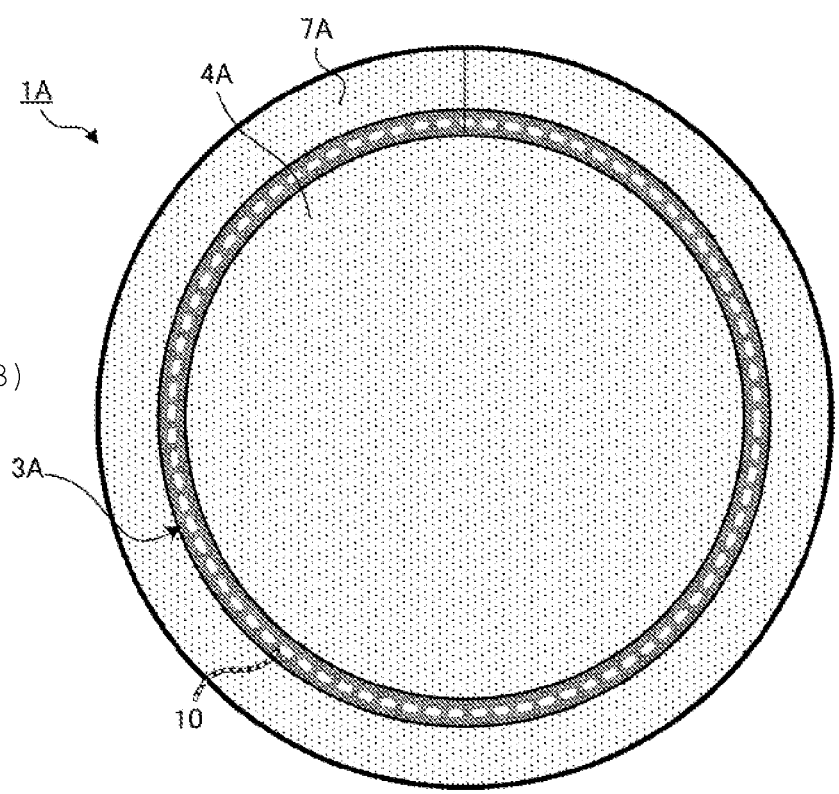

FIG. 4(A) is a schematic view showing a cross section of the bonding member 1 according to the present embodiment. FIG. 4(B) is a schematic view showing a cross section of the bonding member 1A according to the comparative example.

Here, the bonding member 1A shown as the comparative example is obtained by, for example, providing a coating film 3A containing metal particles on a strip-shaped thin plate 7A formed of a low melting point metal and carrying out wire drawing while winding the thin plate 7A around an outer periphery of a columnar core material 4A formed of a low melting point metal to pressure bond the end surfaces of the thin plate 7A to each other and thus to annularly form the coating film 3A and the thin plate 7A.

In the bonding member 1 and the bonding member 1A, the coating films 3 and 3A are likely to contain cracks 10 (internal defects or voids). Specifically, since the coating films 3 and 3A contain the metal particles 5 and the coating material 6, they are likely to contain many interfaces or voids. An intermetallic compound formed by reacting the high melting point metal and the low melting point metal is formed, although its amount is slight, near the tips of the bonding members 1 and 1A remaining after bonding using a soldering iron or the like. Accordingly, in the coating films 3 and 3A near the tips of the bonding members 1 and 1A, cracks 10 may occur due to reduction in volume of the metal particles 5 during the formation reaction of the intermetallic compound. For these reasons, in the bonding member 1 or the bonding member 1A, the cracks 10 may grow along the coating films 3 and 3A, so that interfacial peeling between the coating film and the base material and cracks inside the coating film occur, and there is a fear that the strength of the bonding members 1 and 1A as wires decreases.

However, in the bonding member 1 according to the present embodiment shown in FIG. 4(A), both ends of the coating film 3 are not connected, and each end is covered with the base material 2 and terminated, so that even if the cracks 10 grow along the coating film 3, the bonding member 1 is not divided into a plurality of portions. On the other hand, in the bonding member 1A according to the comparative example shown in FIG. 4(B), both ends of the coating film 3A are connected, so that when the cracks 10 grow along the coating film 3A, there is a fear that the bonding member 1A is divided into a plurality of portions (the thin plate 7A and the core material 4A). Thus, the strength of the bonding member 1 according to the present embodiment as a wire can be made higher than that of the bonding member 1A according to the comparative example.

Next, a specific bonding method for bonding a first bonding target 101 and a second bonding target 102 by using the bonding member 1 will be described.

Figure 5:
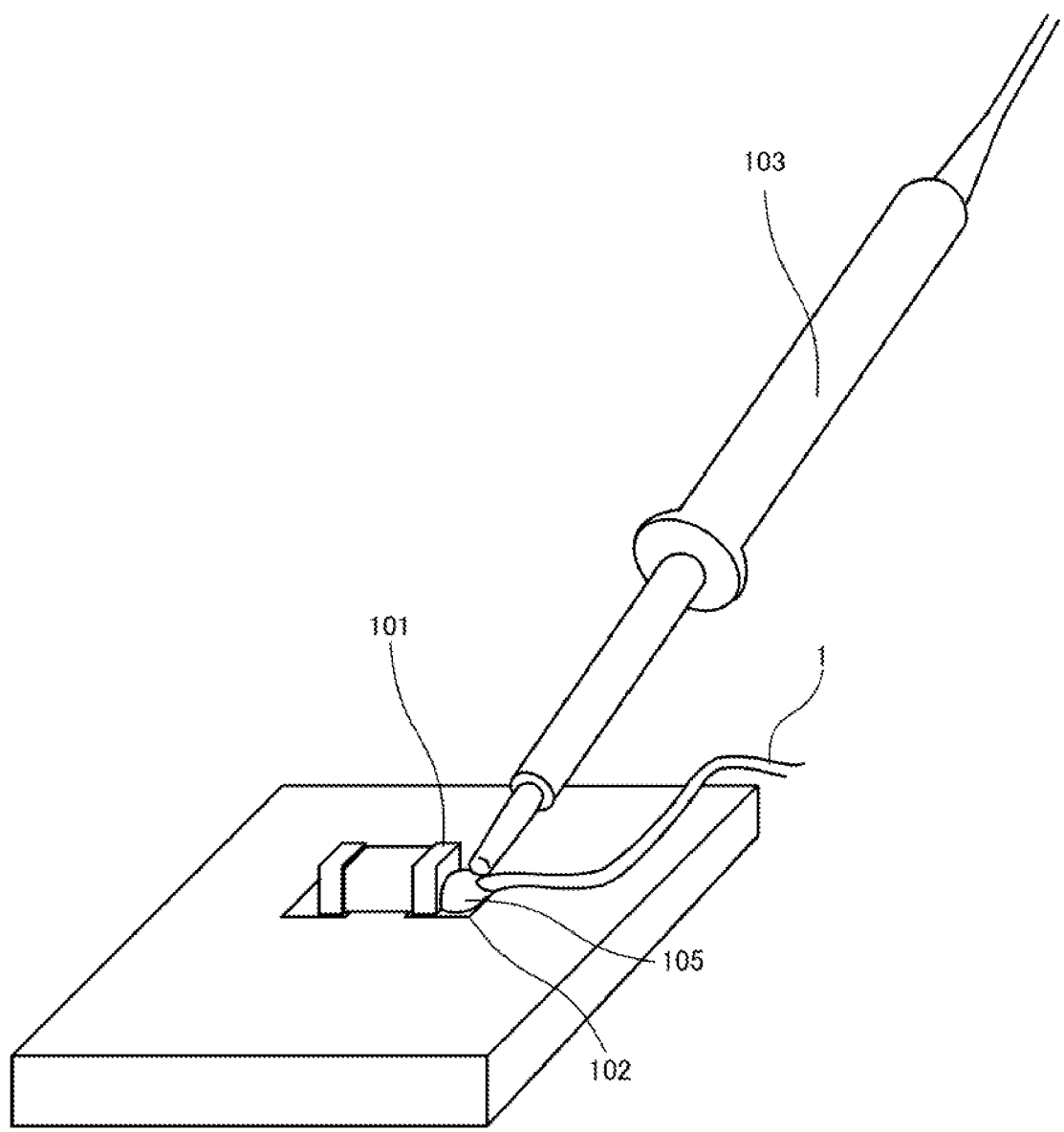
FIG. 5 is a view schematically showing a reaction in the bonding method using the bonding member according to the first embodiment of the present invention.

FIG. 5 is a schematic view showing a bonding method of melting the bonding member 1 by using a soldering iron 103. A first bonding target 101 shown here is, for example, a terminal electrode of an electronic component. A second bonding target 102 is, for example, a mounting electrode provided on a surface of a printed wiring board on which electronic components are mounted.

When the first bonding target 101 and the second bonding target 102 are bonded, the soldering tip of the soldering iron 103 is first caused to generate heat and then applied to the second bonding target 102 (the mounting electrode of the printed wiring board) to warm the second bonding target 102. Then, a tip of the bonding member 1 is lightly pressed against the soldering tip, and the bonding member 1 is sent to the soldering tip while melting the tip of the bonding member 1. Consequently, a melt 105 of the bonding member 1 spreads over the entire first bonding target 101 (the terminal electrode of the electronic component) and the entire second bonding target 102 (the mounting electrode of the printed wiring board). After the melt 105 has a fillet-shape, the tip of the bonding member 1 is separated from the soldering tip of the soldering iron 103, and finally the soldering iron 103 is separated from the melt 105. Thereafter, the melt 105 is cooled and hardened, so that the first bonding target 101 and the second bonding target 102 are bonded to each other.

Figure 6A:
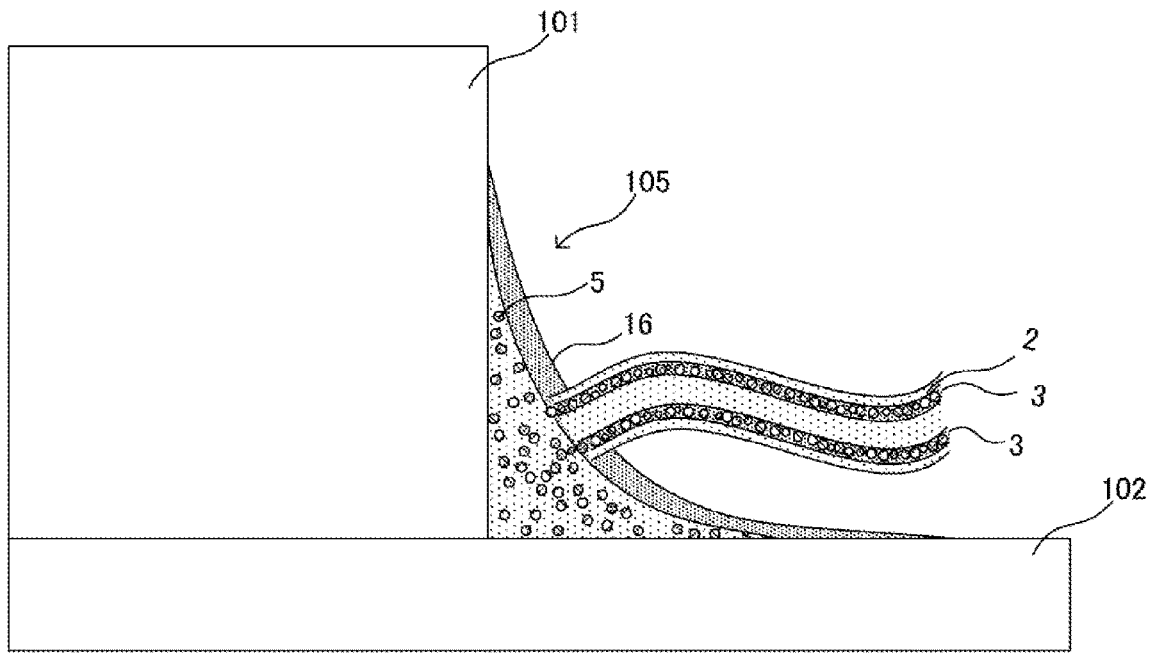
FIGS. 6(A) and 6(B) are views each showing an electron micrograph of a joint portion formed by melting and hardening the bonding member.
Figure 6B:
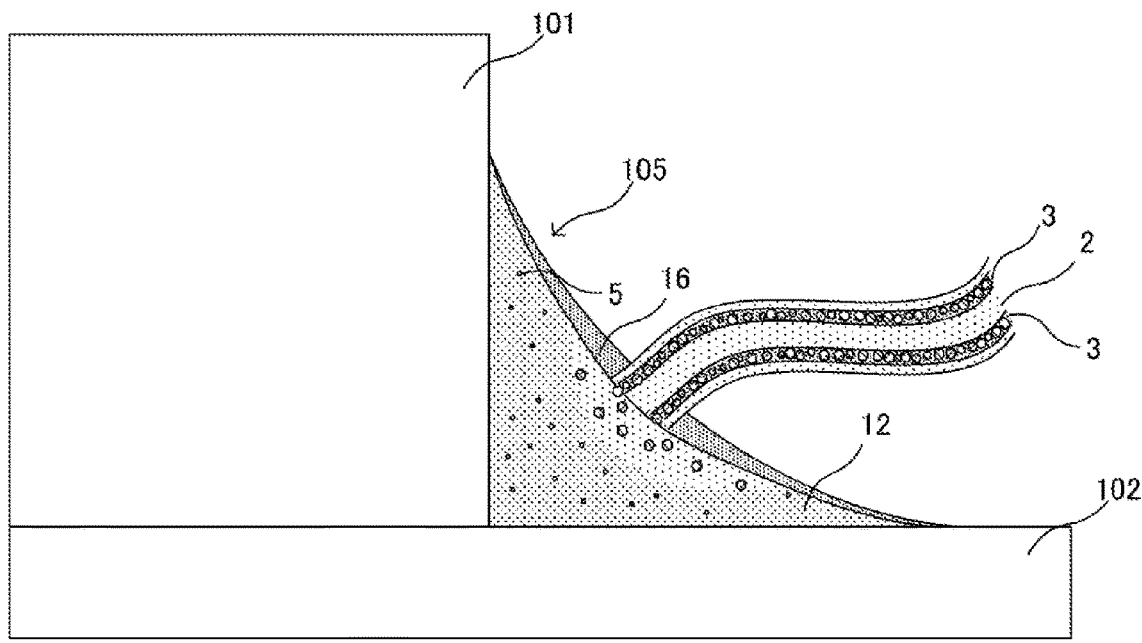

FIGS. 6(A) and 6(B) are schematic views for explaining the formation mechanism of an intermetallic compound in the bonding method using the soldering iron 103.

When the temperature of the tip of the bonding member 1 is raised to a temperature higher than the melting points (softening points) of the low melting point metal and the flux by the soldering iron 103 (not shown), the base material 2 and coating film 3 of the bonding member 1 are melted as shown in FIG. 6(A). This produces the melt 105. In the melt 105, the flux contained in the coating film 3 reduces and removes surface oxide films of the base material 2, the metal particles 5, the first bonding target 101, and the second bonding target 102. Thus, the melt 105 spreads out along the surfaces of the first bonding target 101 and the second bonding target 102, and the metal particles 5 are dispersed inside the melt 105. The flux prevents the surface oxide film of the metal particles 5 from inhibiting the reaction between the high melting point metal and the low melting point metal, and the high melting point metal and the low melting point metal can be reacted with each other efficiently. A residue 16 of the coating film 3 floats on a surface of the melt 105 and covers the surface of the melt 105.

Inside the melt 105, the formation reaction of an intermetallic compound 12 progresses with the lapse of time. That is, as shown in FIG. 6(B), the low melting point metal contained in the melt 105 reacts with the high melting point metal contained in the metal particles 5 to form the intermetallic compound 12. Thus, as the proportion of the intermetallic compound 12 in the composition of the melt 105 increases, the particle sizes of the metal particles 5 decrease and disappear. Since this reaction progresses while the melt 105 maintains a certain high temperature, almost all of the melt 105 will be transformed into the intermetallic compound until the melt 105 is cooled and hardened.

The reaction for forming this intermetallic compound is, for example, a reaction accompanying transient liquid phase diffusion bonding ("TLP bonding"). When the metal particles 5 are formed of a Cu—Ni alloy, examples of the intermetallic compound to be formed include $(Cu,Ni)_6Sn_5$, $Cu_4Ni_2Sn_5$, $Cu_5NiSn_5$, $(Cu,Ni)_3Sn$, $Cu_2NiSn$, and $CuNi_2Sn$. When the metal particles 5 are formed of a Cu—Mn alloy, examples of the intermetallic compound include $(Cu,Mn)_6Sn_5$, $Cu_4Mn_2Sn_5$, $Cu_5MnSn_5$, $(Cu,Mn)_3Sn$, $Cu_2MnSn$, and $CuMn_2Sn$.

Figure 7A:
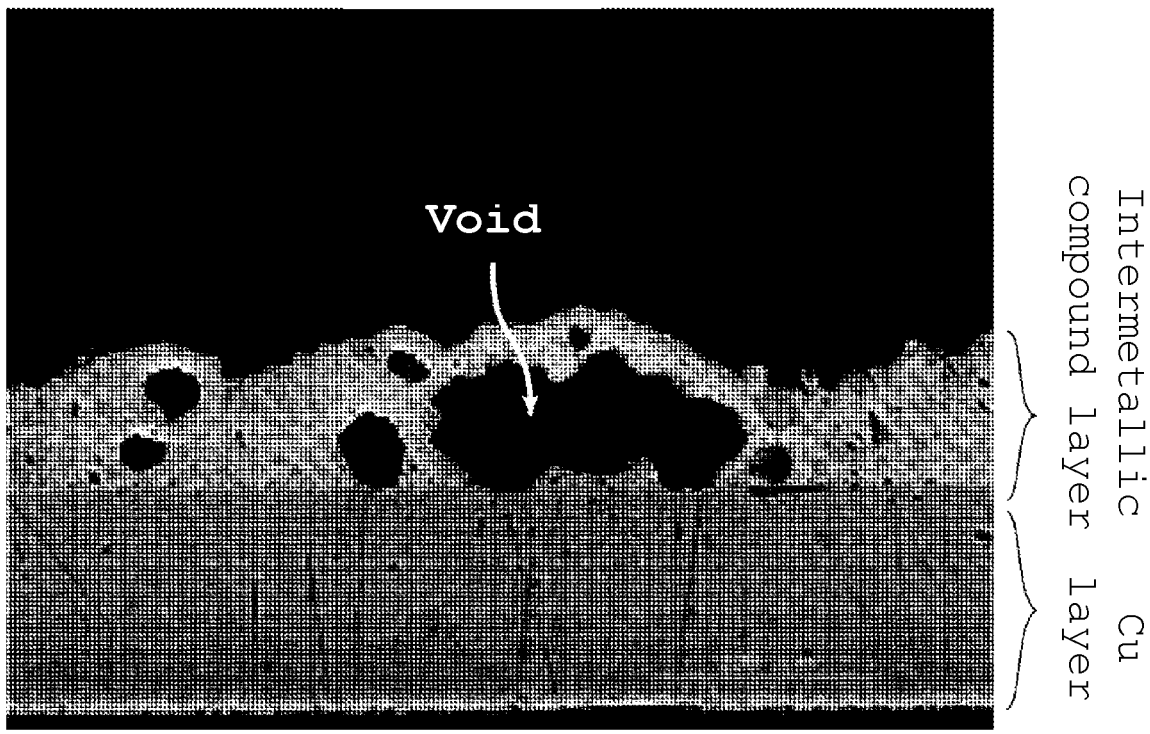
FIGS. 7(A) and 7(B) are schematic views each showing a case where peeling occurs inside the bonding member.
Figure 7B:
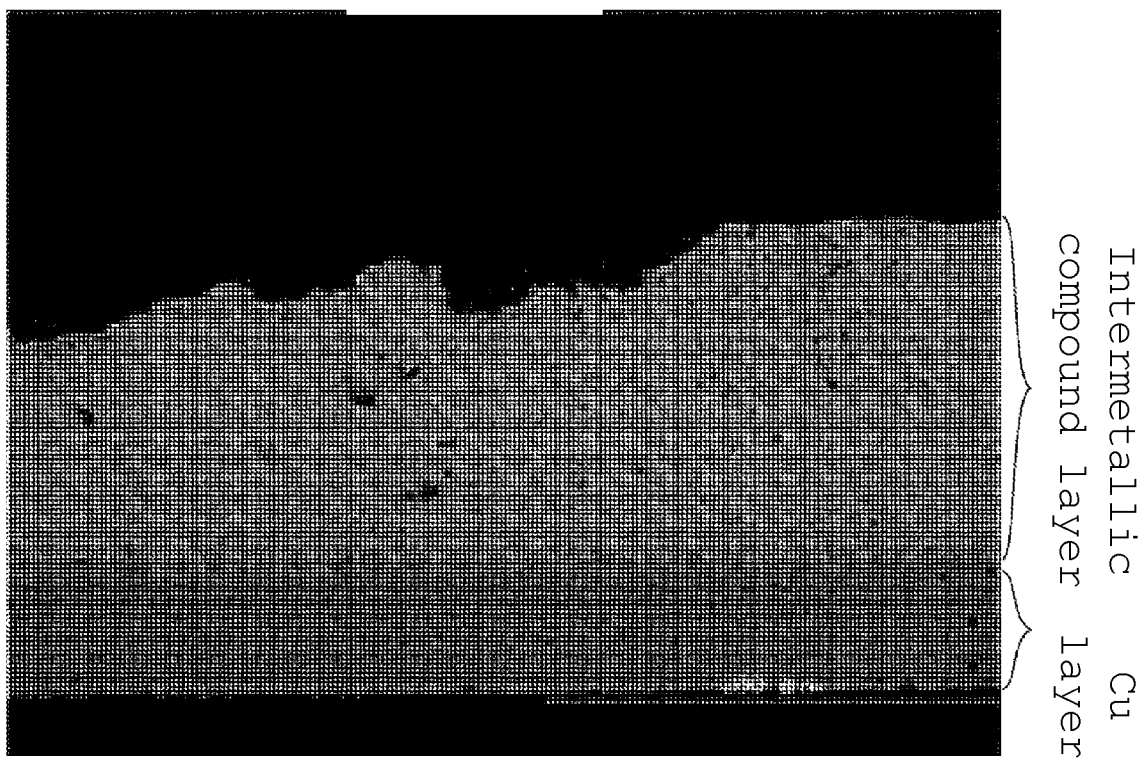

FIGS. 7(A) and 7(B) are electron microscope images each showing a cross section of a joint portion after the bonding member is melted and hardened. The image of FIG. 7(A) is shown for comparison, and FIG. 7(A) shows the cross section of the joint portion (intermetallic compound layer) provided on a copper foil (Cu layer) by a paste-like bonding member (solder paste) containing a low melting point metal and a high melting point metal. FIG. 7(B) shows the cross section of the joint portion (intermetallic compound layer) provided on a copper foil (Cu layer) by a wire-shaped bonding member (wire solder) containing a low melting point metal and a high melting point metal, corresponding to the present embodiments.

In order to make the low melting point metal and the high melting point metal pasty (solder paste) as described above, it is necessary to add a large amount of nonmetallic components such as resin and solvent together with low melting point metal particles and high melting point metal particles. Such nonmetallic components volatilize during melting of the bonding member to form voids at the joint portion after hardening (see FIG. 7(A)). On the other hand, since the wire-shaped bonding member 1 contains only a small amount of nonmetallic components, voids are hardly formed inside the joint portion (see FIG. 7(B)). Therefore, when an electronic component and a substrate are bonded by the bonding member 1 according to this embodiment, it is possible to obtain a joint portion with less voids and high reliability.

Next, a bonding member according to a second embodiment of the present invention and a method for manufacturing the bonding member will be described.

Figure 8:
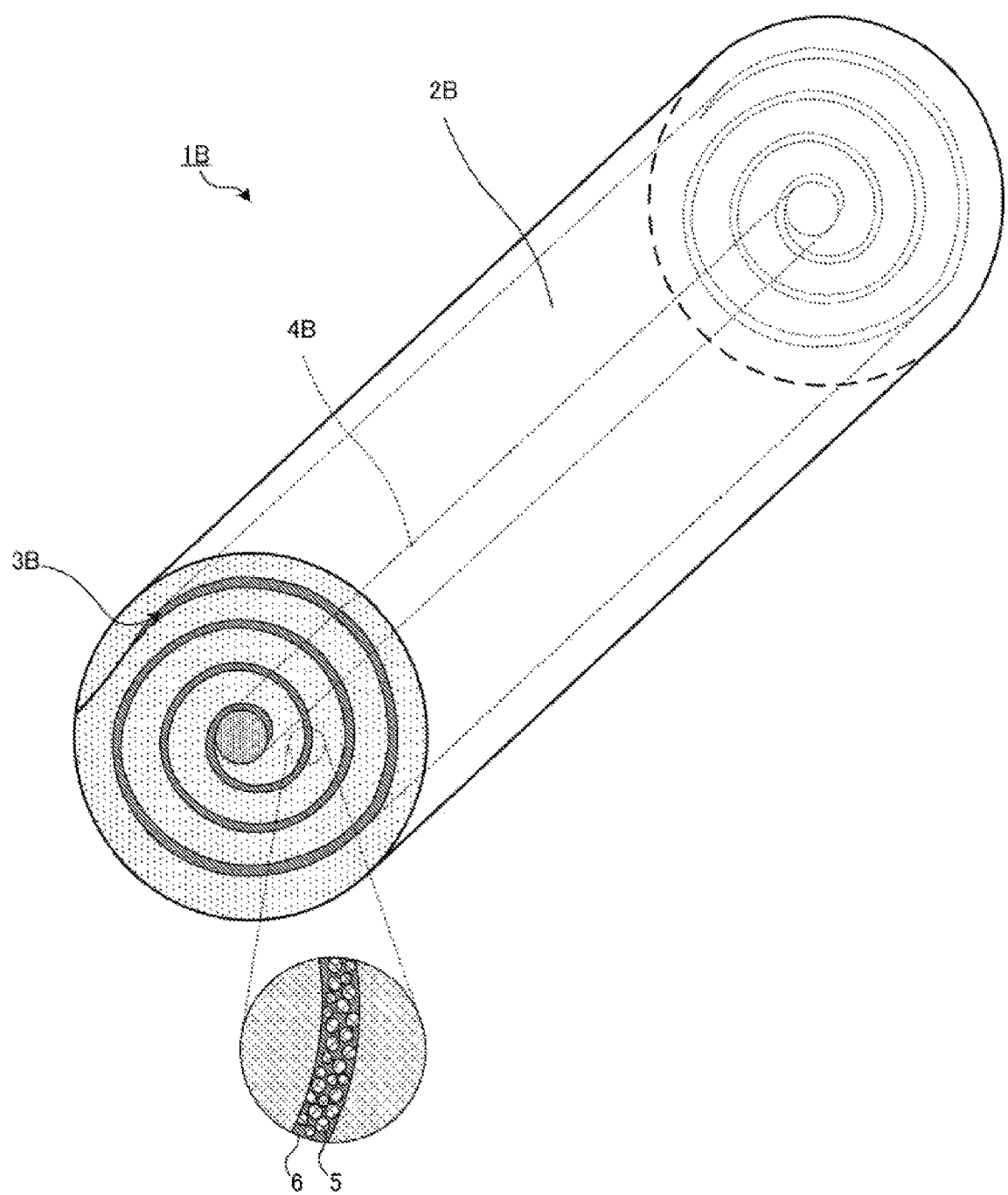
FIG. 8 is a schematic view showing a portion of a bonding member according to a second embodiment of the present invention.

FIG. 8 is a perspective view schematically showing a portion of a bonding member 1B according to a second embodiment of the present invention. The bonding member 1B includes a base material 2B and a coating film 3B, and further includes a core material 4B. The core material 4B is a solid structure containing a low melting point metal that is the same as the low melting point metal contained in the base material 2B and having a linear outer shape extending in the axial direction.

The core material 4B is provided at a center portion in the cross section of the bonding member 1B, and the base material 2B and the coating film 3B are wound around the core material 4B as a center and spirally surround the outside of the core material 4B.

Figure 9:
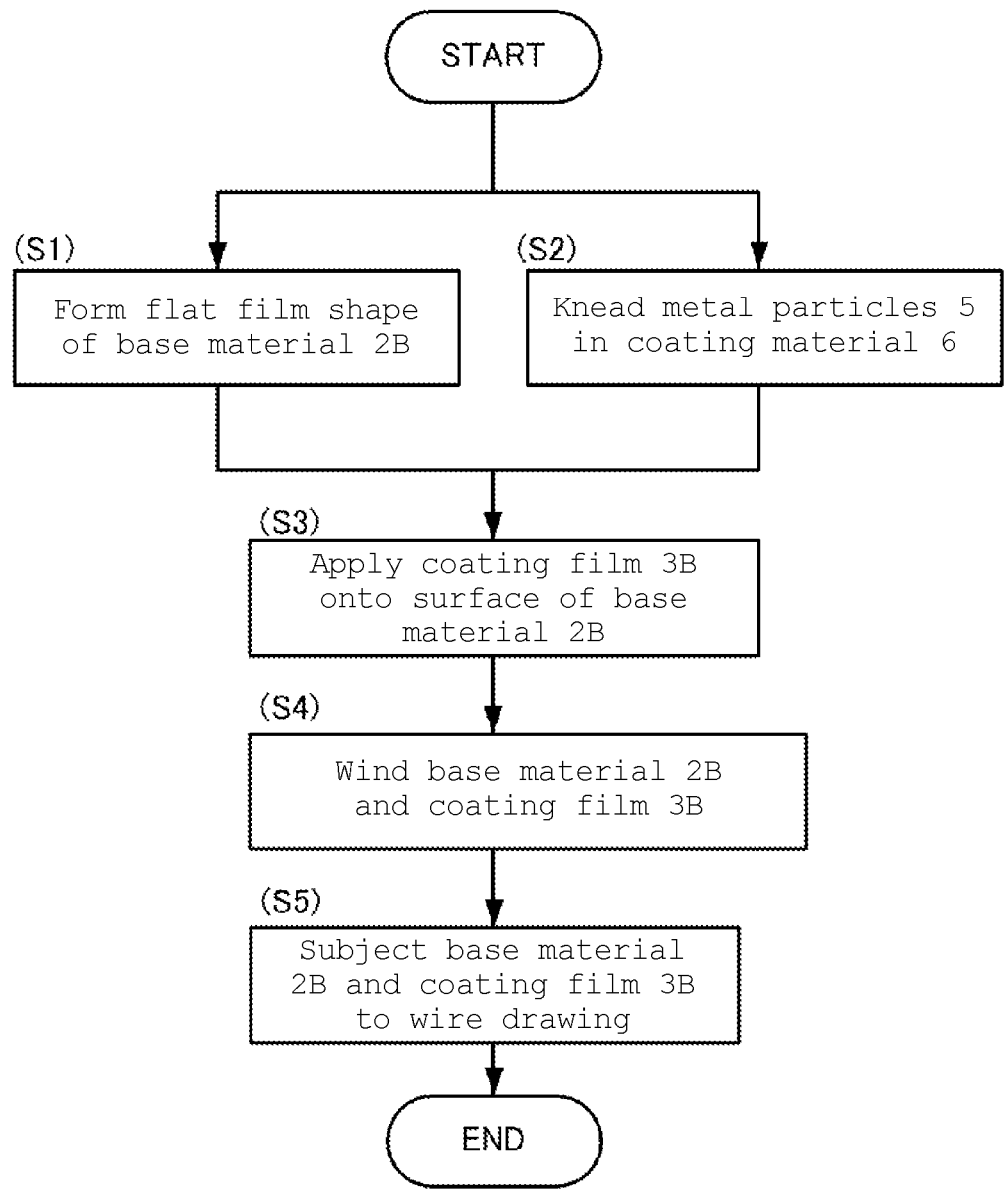
FIG. 9 is a diagram showing an example of a method of manufacturing the bonding member according to the second embodiment of the present invention.

FIG. 9 is a flowchart showing an example of a method for manufacturing the bonding member 1B according to the second embodiment of the present invention.

In the manufacture of the bonding member 1B, first, a base material 2B having a flat film shape and formed of low melting point metal is formed (S1).

In addition, metal particles formed of high melting point metal are kneaded in a coating material in a state of being softened by heating to provide a material of a coating film 3B (S2).

Then, the material of the coating material 3B is provided on one main surface of the base material 2B by means of coating or the like while softened by heating (S3).

Then, a wire-shaped core material 4B is prepared, and the base material 2B and the coating film 3B are wound around the core material 4B (S4). Thereafter, if necessary, the core material 4B and the base material 2B and the coating film 3B in a state of being wound around the core material 4B are extended by wire drawing, and then stretched such that the wire size becomes small and the axial length becomes long (S5).

The wire-shaped bonding member 1B containing the high melting point metal and the low melting point metal can be easily manufactured by such a manufacturing method. With such a manufacturing method, unnecessary gaps are unlikely to be formed in the center portion of the bonding member 1B, and the bonding member 1B can be easily manufactured by winding the base material 2B and the coating film 3B around the core material 4B. In addition, shape reproducibility (shape accuracy) can be increased during manufacture of the bonding member 1B. In particular, by using the core material 4B as a cushioning material, the coating film 3B can be protected against bending.

In the bonding member 1B having this configuration, the amount of the low melting point metal in the entire composition is increased by the core material 4B, and unreacted low melting point metal is easily and partially formed (deposited) at the joint portion after melting and hardening. Such unreacted low melting point metal melts during the formation reaction of the intermetallic compound and acts so as to fill a gap formed by the formation of the intermetallic compound, so that voids in the joint portion can be reduced, and the strength of the joint portion can be further improved.

Next, a bonding member according to a third embodiment of the present invention and a bonding method using the bonding member will be described.

Figure 10:
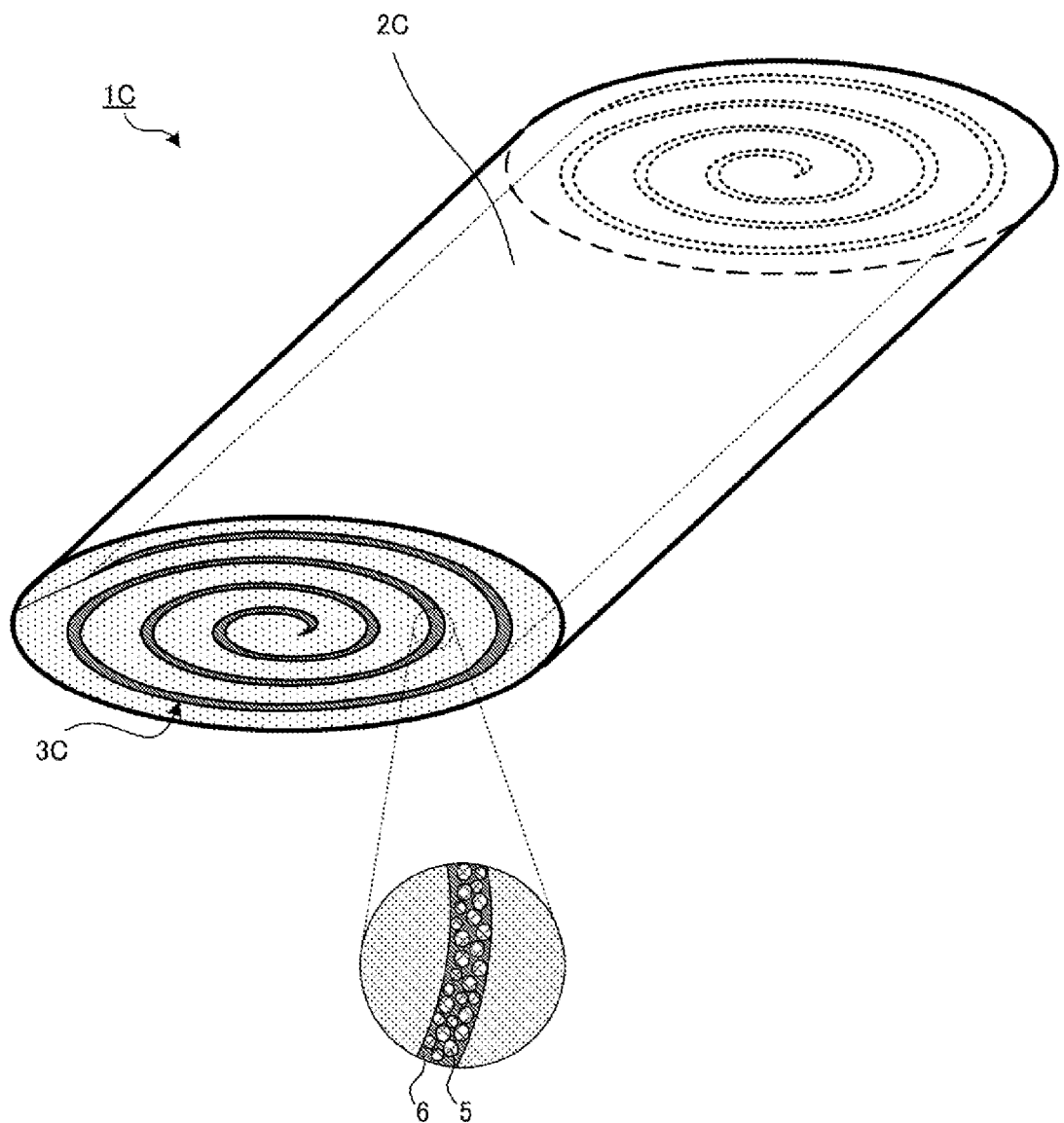
FIG. 10 is a schematic view showing a portion of a bonding member according to a third embodiment of the present invention.

FIG. 10 is a perspective view schematically showing a portion of a bonding member 1C according to the third embodiment. This bonding member 1C has a configuration similar to that of the first embodiment and includes a base material 2C and a coating film 3C. However, an outer peripheral surface of the base material 2C is crushed from one direction, and the entire cross-sectional shape is a flat shape.

A specific bonding method for bonding a first bonding target 101C and a second bonding target 102C by using the bonding member 1C will be described.

Figure 11A:
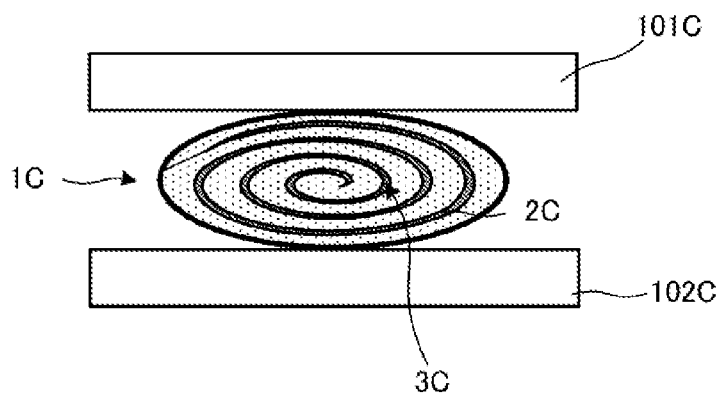
FIGS. 11(A) to 11(C) are views schematically showing a bonding method using the bonding member according to the third embodiment of the present invention.
Figure 11B:
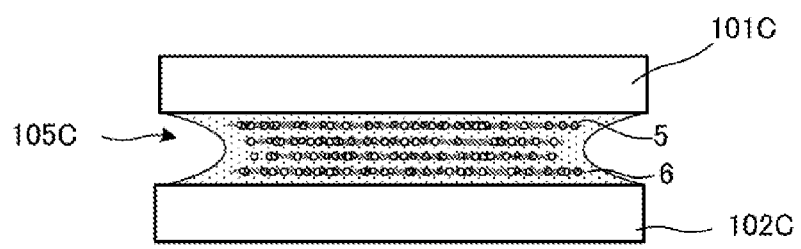
Figure 11C:
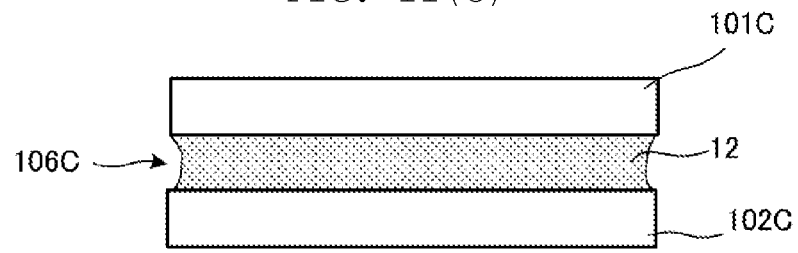

FIGS. 11(A) to 11(C) are schematic views each showing a bonding method of melting the bonding member 1C by using thermocompression bonding. When the first bonding target 101C and the second bonding target 102C are bonded, first, the bonding member 1C is cut out by a required length. Then, the bonding member 1C is sandwiched between the first bonding target 101C and the second bonding target 102C (see FIG. 11(A)). While the first bonding target 101C and the second bonding target 102C are heated in this state, the interval between both of them is narrowed, and the bonding member 1C is pressurized and heated. Consequently, the base material 2C and a coating material 6 contained in the coating film 3C are melted, and a melt 105C spreads between the first bonding target 101C and the second bonding target 102C (see FIG. 11(B)). Thereafter, inside the melt 105C, metal particles 5 contained in the coating film 3C react with surrounding low melting point metal, and the formation of an intermetallic compound 12 progresses (see FIG. 11(C)). Consequently, the melt 105C is cooled and hardened, so that a joint portion 106C formed of the intermetallic compound 12 is formed between the first bonding target 101C and the second bonding target 102C.

As described above, the bonding member of the present invention can also be used for a bonding method using thermocompression bonding. In a case where thermocompression bonding is used, a flat cross-sectional shape likewise the cross-sectional shape of the bonding member 1C according to this embodiment can stabilize an arrangement posture of the bonding member 1C.

Next, a bonding member according to a fourth embodiment of the present invention will be described.

Figure 12:
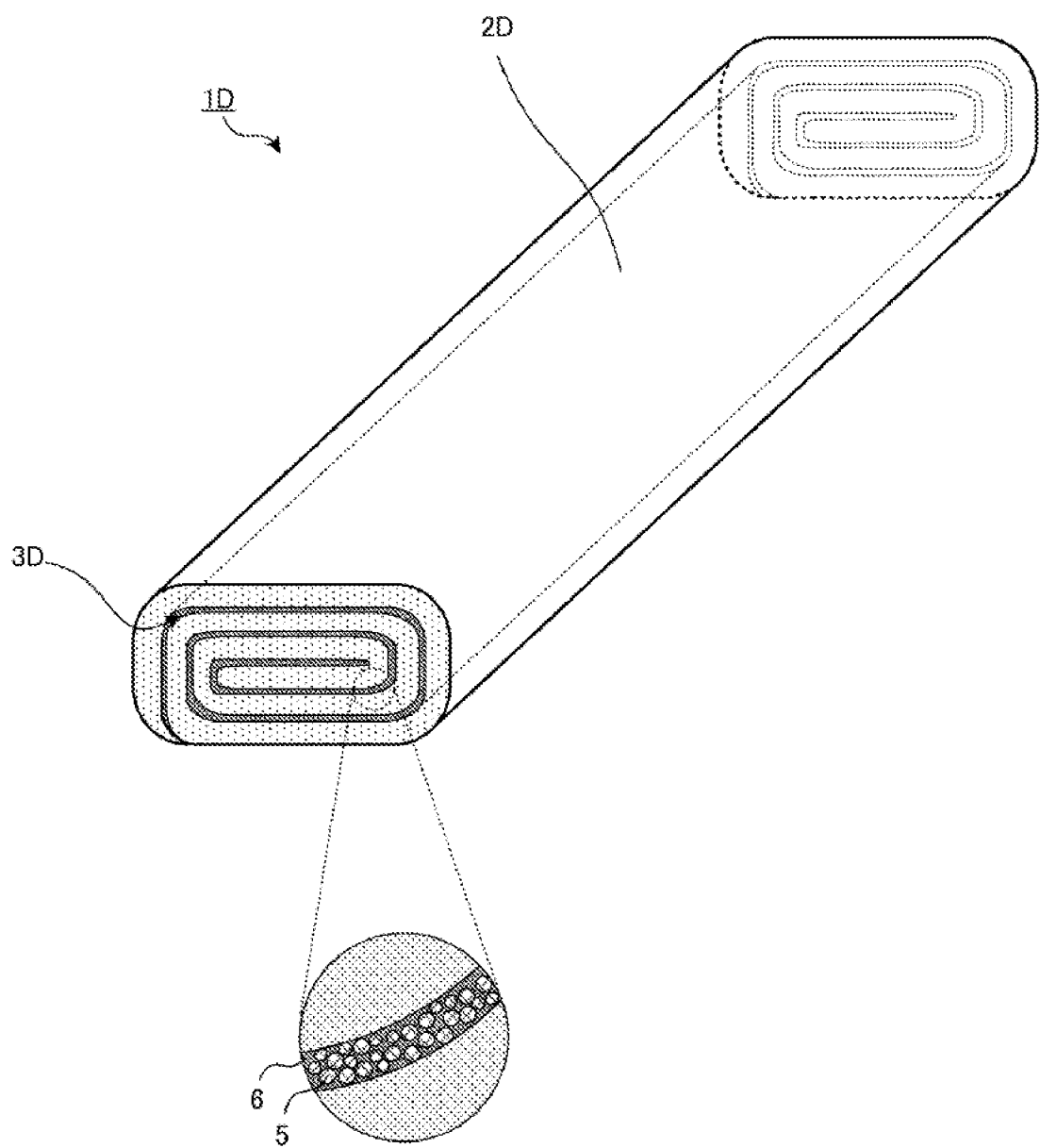
FIG. 12 is a schematic view showing a portion of a bonding member according to a fourth embodiment of the present invention.

FIG. 12 is a perspective view schematically showing a portion of a bonding member 1D according to the fourth embodiment of the present invention. The bonding member 1D as a whole has a rectangular cross section rather than a circular cross section. The bonding member 1D may have such a cross-sectional shape, and in this case, a base material 2D provided with a coating film 3D is wound to be folded back, so that the bonding member 1D can be manufactured. Accordingly, the bonding member 1D is easy to be manufactured.

Figure 13A:
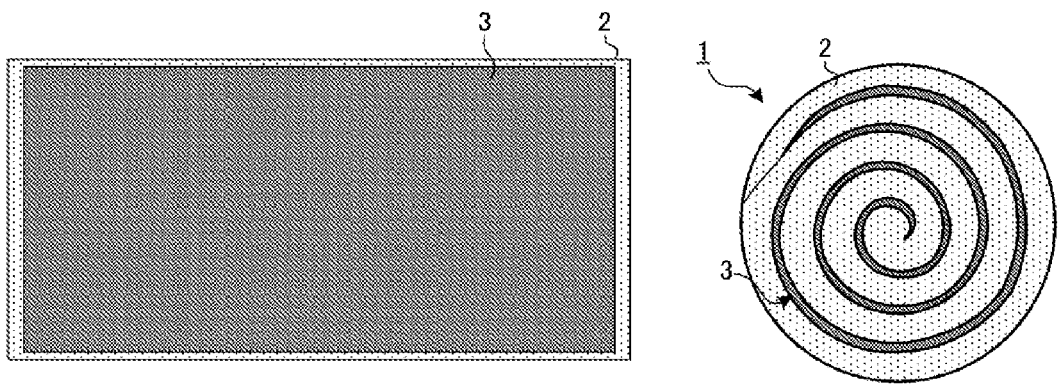
FIGS. 13(A) to 13(C) are schematic views each showing a bonding member according to a variation of the present invention.
Figure 13B:
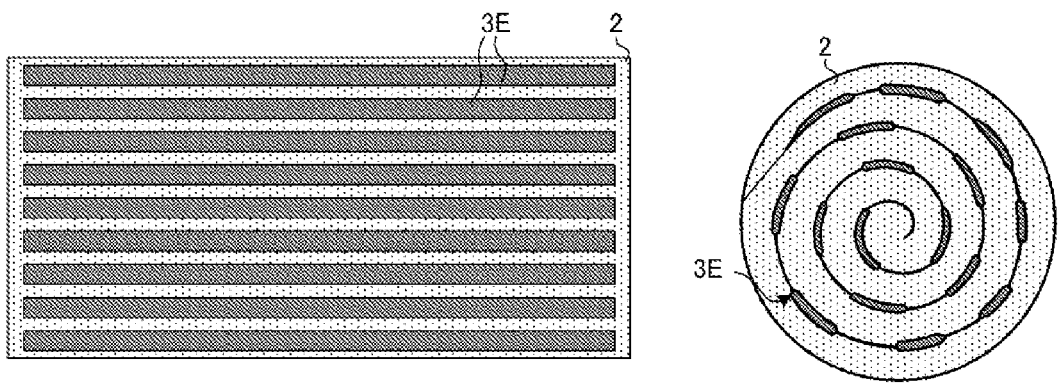
Figure 13C:
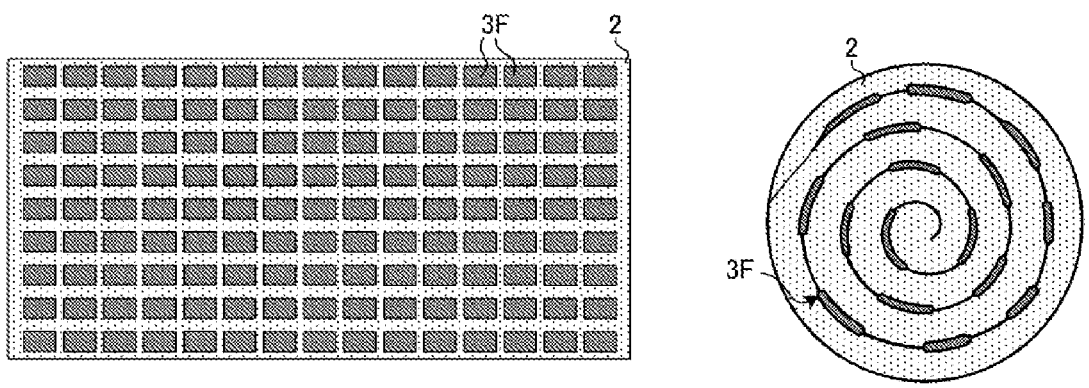

Next, a bonding member according to a variation of the present invention will be described. FIGS. 13(A) to 13(C) are schematic views each showing a base material 2 before winding in a manufacturing process and a cross section of the base material 2 after winding.

FIG. 13(A) shows a case where the configurations according to the first to fourth embodiments are realized. In this variation, a coating film 3 is provided on substantially the entire surface of the base material 2 having a flat film shape and wound, so that the coating film 3 as well as the base material 2 are spirally formed in the cross section of a bonding member 1.

FIG. 13(B) shows a case where a plurality of coating films 3E each having a thin belt shape are provided on one main surface of a base material 2 having a flat film shape. In this case, the plurality of coating films 3E are provided on a base material 3 before winding such that the coating films 3E extend in parallel along the axial direction of a bonding member 1, and the coating films 3E are wound. Consequently, in the cross section of the bonding member 1, the plurality of coating films 3E can be dispersedly arranged along the spiral internal interface of the base material 2. Then, both surfaces of the base material 2 are bonded to each other along the spiral internal interface of the base material 2 also at a portion between the coating films 3E, and it is possible to increase an area of a region where both surfaces of the base material 2 are brought into contact with each other and bonded inside the bonding member 1. Accordingly, it is possible to make it difficult for defects such as peeling to occur inside the bonding member 1.

FIG. 13(C) shows a case where rectangular coating films 3F are arrayed vertically and horizontally on one main surface of a base material 2 having a flat film shape. In this case, a plurality of the coating films 3F are arrayed not only at the spiral internal interface of a bonding member 1 but also in the axial direction of the bonding member 1, so that both surfaces of the base material 2 are bonded to each other at regular intervals along the axial direction of the bonding member 1. With this configuration, it is possible to further increase an area of a region where both surfaces of the base material 2 are in contact with each other and bonded in the bonding member 1, and it is possible to make it more difficult for defects such as peeling to occur in the bonding member 1.

The term "spiral" described above includes not only a strictly spiral shape but also a double spiral shape in which the winding direction of the base material is reversed on its way and a substantially spiral shape such as a shape in which a portion around an end in the winding direction of the base material or the like is partially non-spiral. That is, it may be sufficient that at least a portion of the base material has a spiral structure. Although each of the embodiments described above shows the example in which the "coating film" is formed as the "film" according to the present invention, the "film" according to the present invention is not limited thereto, and a film formed by using other method such as plating or vapor deposition may be adopted as long as it has a film shape. In this case, the low melting point metal may be contained in the film as a composition rather than metal particles.

Finally, the description of the above embodiments and variation is to be considered in all respects as illustrative and not limiting. The scope of the present invention is indicated not by the above embodiments but by the claims. Further, the scope of the present invention includes the claims and their equivalents.

DESCRIPTION OF REFERENCE SYMBOLS

1: Bonding member
2: Base material
3: Coating film
4B: Core material
5: Metal particles
6: Coating material (flux)
12: Intermetallic compound
101, 102: Bonding target

The invention claimed is:

1. A bonding member comprising:
a base material that has a spiral shape when viewing a cross section thereof orthogonal to a longitudinal direction thereof and contains a first melting point metal, the spiral shape forming a gap between opposed surfaces of the base material; and
a film provided in the gap between the opposed surfaces of the base material, wherein the film contains a second melting point metal having a melting point higher than that of the first melting point metal, that forms an intermetallic compound having a melting point higher than the melting point of the first melting point metal by reaction of the second melting point metal with a melt of the first melting point metal,
wherein the film contains a flux, and the second melting point metal is in the form of metal particles.

2. The bonding member according to claim 1, wherein
the first melting point metal is Sn or a Sn alloy, and
the second melting point metal is a Cu—Ni alloy, a Cu—Ni—Co alloy, a Cu—Ni—Fe alloy, a Cu—Mn alloy, a Cu—Cr Alloy, or a Cu—Al alloy.

3. The bonding member according to claim 1, wherein a weight ratio of the metal particles to the flux is in a range of 75:25 to 99.5:0.5.

4. The bonding member according to claim 1, wherein the metal particles have an average particle size (D50) in a range of 0.1 to 30 μm.

5. The bonding member according to claim 1, wherein the film has a spiral shape in the cross section of the base material.

6. The bonding member according to claim 1, wherein the film is dispersedly arranged at a plurality of positions in the cross section of the base material.

7. The bonding member according to claim 1, further comprising a core material that is provided at a center portion in the cross section of the base material and contains a third melting point metal.

8. The bonding member according to claim 1, wherein the base material has a flat shape when viewing the cross section orthogonal to the longitudinal direction.

9. A bonding method comprising:
disposing the bonding member according to claim 1 between a first bonding target and a second bonding target; and
heating the bonding member, the first bonding target and the second bonding target while applying pressure between the first bonding target and the second bonding target.

10. A method for manufacturing a bonding member, the method comprising:
providing, on a flat film-shaped base material containing a first melting point metal, a film containing a second melting point metal, the second melting point metal having a higher melting point than that of the first melting point metal and that forms an intermetallic compound having a melting point higher than a melting point of the first melting point metal by reaction of the second melting point metal with a melt of the first melting point metal; and
winding the base material provided with the film into a spiral shape,
wherein the film contains a flux, and the second melting point metal is in the form of metal particles, and
wherein the film has a spiral shape in a cross section of the base material.

11. The method for manufacturing a bonding member according to claim 10, wherein
the first melting point metal is Sn or a Sn alloy, and
the second melting point metal is a Cu—Ni alloy, a Cu—Ni—Co alloy, a Cu—Ni—Fe alloy, a Cu—Mn alloy, a Cu—Cr Alloy, or a Cu—Al alloy.

12. The method for manufacturing a bonding member according to claim 10, wherein a weight ratio of the metal particles to the flux is in a range of 75:25 to 99.5:0.5.

13. The method for manufacturing a bonding member according to claim 10, wherein the metal particles have an average particle size (D50) in a range of 0.1 to 30 μm.

14. The method for manufacturing a bonding member according to claim 10, wherein the film is dispersedly arranged at a plurality of positions in a cross section of the base material.

15. The method for manufacturing a bonding member according to claim 10, further comprising providing a core material contains a third melting point metal, and wherein the winding of the base material provided with the film into the spiral shape is carried out such that the core materials is at a center portion in a cross section of the base material.

16. The method for manufacturing a bonding member according to claim 10, wherein the base material has a flat shape when viewing a cross section thereof orthogonal to the longitudinal direction thereof.

* * * * *